(12) United States Patent
Lee et al.

(10) Patent No.: US 7,829,937 B2
(45) Date of Patent: Nov. 9, 2010

(54) SEMICONDUCTOR MEMORY DEVICES PERFORMING ERASE OPERATION USING ERASE GATE AND METHODS OF MANUFACTURING THE SAME

(75) Inventors: Sung-Hoon Lee, Yongin-si (KR); Sungil Park, Suwon-si (KR); Young-Gu Jin, Hwaseong-si (KR); Jongseob Kim, Suwon-si (KR); Ki-Ha Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 464 days.

(21) Appl. No.: 11/980,351

(22) Filed: Oct. 31, 2007

(65) Prior Publication Data

US 2008/0164510 A1 Jul. 10, 2008

(30) Foreign Application Priority Data

Jan. 5, 2007 (KR) .................... 10-2007-0001695

(51) Int. Cl.
*H01L 29/76* (2006.01)
*H01L 29/788* (2006.01)
*H01L 29/792* (2006.01)

(52) U.S. Cl. .................... 257/324; 257/326; 257/320
(58) Field of Classification Search ......... 257/314–326, 257/E27.078, E29.129
See application file for complete search history.

(56) References Cited

U.S. PATENT DOCUMENTS 6,747,310 B2 * 6/2004 Fan et al. .................... 257/320
7,420,243 B2 * 9/2008 Kim et al. .................... 257/316

* cited by examiner

*Primary Examiner*—Cuong Q Nguyen
(74) *Attorney, Agent, or Firm*—Harness, Dickey & Pierce, P.L.C.

(57) ABSTRACT

A semiconductor memory device performing an erase operation using an erase gate and a method of manufacturing the same are provided. The memory device may include a charge trap layer storing a first charge transfer medium having a first polarity and at least one erase gate. The at least one erase gate may be formed below the charge trap layer. A second charge transfer medium, which has a second polarity opposite to the first polarity, may be stored in the at least one erase gate. During the erase operation, the second charge transfer medium migrates to the charge trap layer causing the first charge transfer medium to combine with the second charge transfer medium.

20 Claims, 13 Drawing Sheets

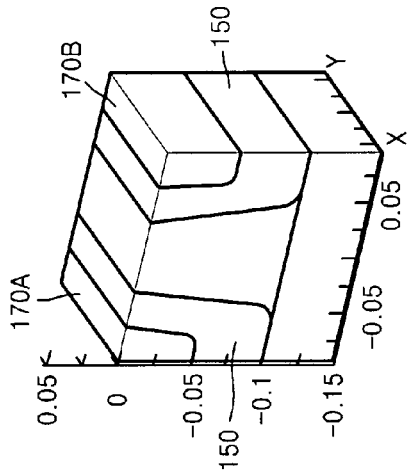
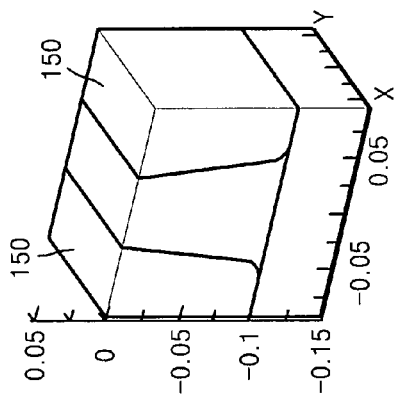
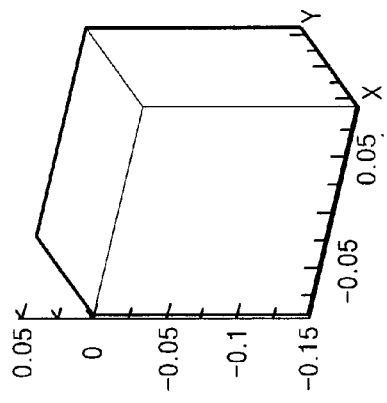
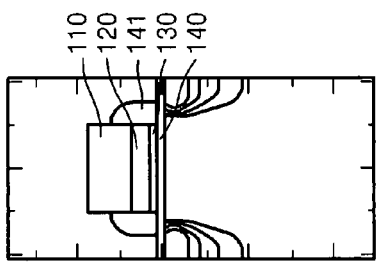
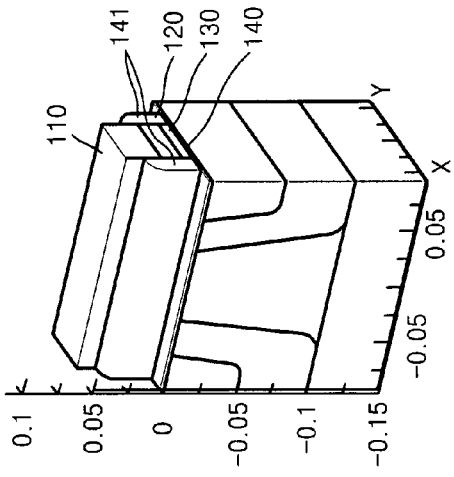
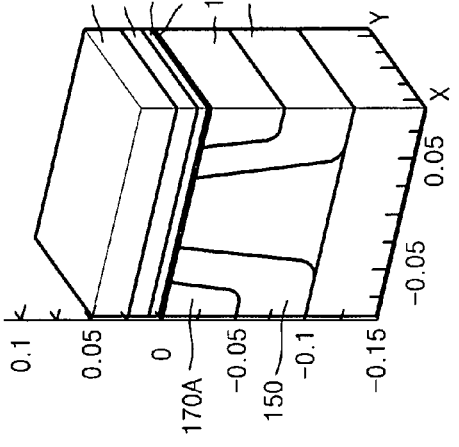

US 7,829,937 B2

SEMICONDUCTOR MEMORY DEVICES PERFORMING ERASE OPERATION USING ERASE GATE AND METHODS OF MANUFACTURING THE SAME

PRIORITY STATEMENT

This application claims the benefit of priority under 35 U.S.C. §119 from Korean Patent Application No. 10-2007-0001695, filed on Jan. 5, 2007, in the Korean Intellectual Property Office, the disclosure of which is incorporated herein by reference its entirety.

BACKGROUND

1. Field

Example embodiments relate to semiconductor memory devices and methods of manufacturing the semiconductor memory device. Other example embodiments relate to semiconductor memory devices that perform an erase operation using an erase gate and methods of manufacturing the semiconductor memory device.

2. Description of the Related Art

A non-volatile memory device, which electrically erases and programs data, preserves stored data even when no supply voltage is applied thereto. A non-volatile memory device is, for example, a flash memory.

Each of a plurality of memory cells constituting a flash memory includes a cell transistor with a control gate, a floating gate, a source and a drain. Program or erase operations may be performed in the cell transistor using a Fowler-Nordheim (F-N) tunneling mechanism. However, the size of the floating gate is limited to the reduction in the size of the flash memory.

In order to overcome the size limitation of the floating gate, a non-volatile memory device (hereinafter referred to as a "charge trap memory device") including a charge trap layer instead of a floating gate has been developed. The charge trap memory device stores electrons in the charge trap layer. The charge trap memory device may be smaller than a conventional non-volatile memory device that stores electrons in a floating gate.

In a conventional charge trap memory device, as program and erase operations are repeated, an interface trap and an oxide trap may form. In more detail, if the conventional charge trap memory device is in an erase mode, a high voltage may be applied to a semiconductor substrate of the device. A plurality of holes may be injected into the charge trap layer from the semiconductor substrate such that electrons stored in the charge trap layer are removed.

In this case, silicon-hydrogen (Si—H) bonds that exist in the interface between the semiconductor substrate and a polysilicon layer are broken and an interface trap may form between the semiconductor substrate and the polysilicon layer. Hydrogen (H) elements caused by the breaking of the Si—H bonds are moved (or migrate) inside the polysilicon layer and form an oxide trap. As such, the reliability of the charge trap memory device deteriorates.

A structure having components arranged on an insulation layer (e.g., a Thin Film Transistor (TFT) or Silicon On Insulator (SOI)) may be used. As described above, if a conventional charge trap memory device is in an erase mode, a high voltage may be applied to a semiconductor substrate of the device.

SUMMARY

Example embodiments provide semiconductor memory devices that perform an erase operation using an erase gate and methods of manufacturing the same.

According to example embodiments, there is provided a semiconductor memory device including a charge trap layer storing a first charge transfer medium having a first polarity, and at least one erase gate formed below the charge trap layer. The at least one erase gate may include a second charge transfer medium having a second polarity opposite to the first polarity. In an erase mode, the second charge transfer medium migrates to the charge trap layer causing the first charge transfer medium to combine with the second charge transfer medium.

According to example embodiments, the first charge transfer medium may be a plurality of electrons and the second charge transfer medium may be a plurality of holes.

According to other example embodiments, there is provided a semiconductor device including at least one erase gate formed on an insulation layer, and a charge trap layer formed on the At least one erase gate. The charge trap layer may store a first charge transfer medium having a first polarity. The at least one erase gate may include a second charge transfer medium having a second polarity opposite to the first polarity. In an erase mode, the second charge transfer medium migrates to the charge trap layer causing the first charge transfer medium to combine with the second charge transfer medium.

According to example embodiments, there is also provide a method of manufacturing a semiconductor memory device including forming at least one oxidation region on a top region of a semiconductor substrate, forming at least one erase gate on the at least one oxidation region, and forming a charge trap layer on the at least one erase gate. The charge trap layer may store a first charge transfer medium having a first polarity and the at least one erase gate may include a second charge transfer medium having a second polarity opposite to the first polarity.

Example embodiments also provide a method of manufacturing a semiconductor memory device including forming at least one erase gate on an insulation layer, and forming a charge trap layer on the at least one erase gate. The charge trap layer may store a first charge transfer medium having a first polarity and the at least one erase gate may include a second charge transfer medium having a second polarity opposite to the first polarity.

In an erase mode, a second charge transfer medium in the at least one erase gate migrates to the charge trap layer causing the first charge transfer medium stored in the charge trap layer to combine with the second charge transfer medium.

BRIEF DESCRIPTION OF THE DRAWINGS

Example embodiments will be more clearly understood from the following detailed description taken in conjunction with the accompanying drawings. FIGS. 1-11E represent non-limiting, example embodiments as described herein.

FIG. 1 is a diagram illustrating a cross-sectional view of a semiconductor memory device according to example embodiments;

FIG. 2 is a diagram illustrating an erase operation of the semiconductor memory device illustrated in FIG. 1;

FIG. 4 is a diagram illustrating a program operation in the semiconductor memory device illustrated in FIG. 1;

FIG. 5 is a diagram of a read operation in the semiconductor memory device illustrated in FIG. 1;

FIGS. 6A to 6F are diagrams illustrating perspective views of a method of manufacturing a semiconductor memory device according to example embodiments;

FIG. 7 is a diagram illustrating a perspective view of a semiconductor memory device according to example embodiments;

FIGS. 11A through 11E are diagrams illustrating a read operation in the semiconductor memory device illustrated in FIG. 7.

DETAILED DESCRIPTION OF EXAMPLE EMBODIMENTS

Figure 1:
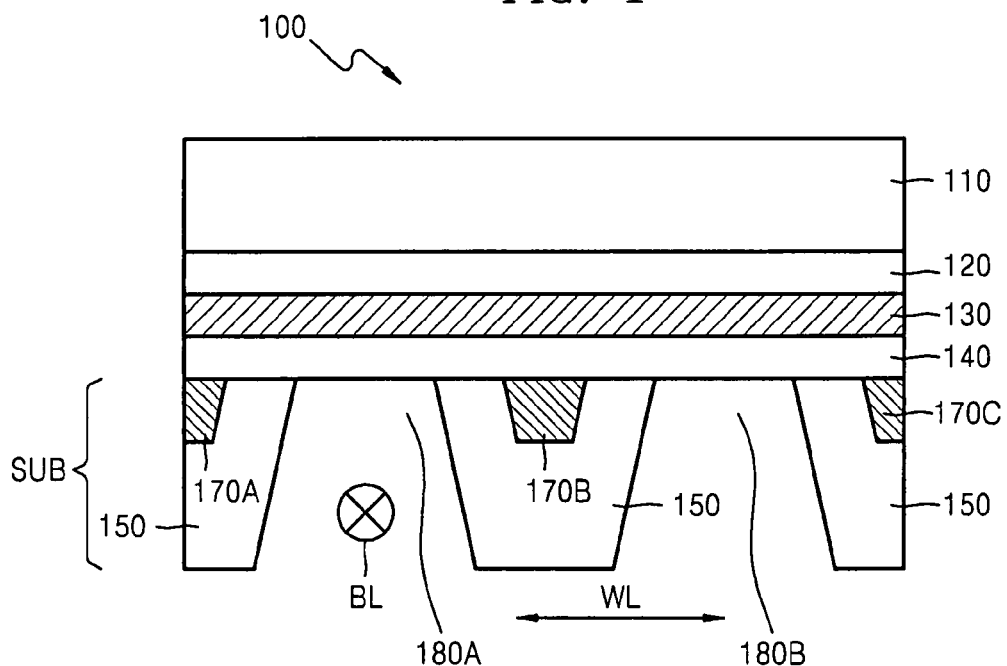

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to semiconductor memory devices and methods of manufacturing the same. Other example embodiments relate to semiconductor memory devices that perform an erase operation using an erase gate and method of manufacturing the same.

FIG. 1 is a diagram illustrating a cross-sectional view of a semiconductor memory device 100 according to example embodiments.

Referring to FIG. 1, the semiconductor memory device 100 includes a semiconductor substrate SUB, a charge trap layer 130 and at least one erase gate 170A. The semiconductor memory device may include more than one erase gate (e.g., erase gates 170A, 170B and/or 170C). The charge trap layer 130 may be formed on the semiconductor substrate SUB. The charge trap layer 130 may store electrons. The erase gates 170A, 170B and 170C may be formed below the charge trap layer 130. The semiconductor substrate SUB may be a bulk silicon substrate.

In an erase mode including an operation of removing the electrons stored in the charge trap layer 130, holes in the erase gates 170A, 170B, and 170C may be injected into (or transferred to) the charge trap layer 130 to recombine (or combine) the electrons stored in the charge trap layer 130 with the holes. The electrons stored in the charge tap layer 130 may be removed.

In the erase mode, the semiconductor memory device 100 may apply a high voltage to the erase gates 170A, 170B and 170C. If the high voltage is applied to the erase gates 170A, 170B and 170C, a potential gradient may be generated. The holes of the erase gates 170A, 170B and 170C may drift (or migrate) to the charge trap layer 130.

The erase gates 170A, 170B and 170C may contain a conductive material. The erase gates 170A, 170B and 170C may include metal, polysilicon or a material which allows hole injection (or transferred) therein.

The semiconductor substrate SUB may include at least one channel region 180A and 180B. The channel regions 180A and 180B may be formed in a top surface of the semiconductor substrate SUB.

In a program mode including an operation of storing electrons in the charge trap layer 130, electrons in the channel regions 180A and 180B may be injected into (or transferred to) the charge trap layer 130.

The erase gates 170A, 170B and/or 170C may be disposed (or formed) between the channel regions 180A and 180B. For example, the erase gate 170B may be disposed (or formed) between the channel region 180A and the channel region 180B. The channel region 180A may be disposed (or formed) between the erase gate 170A and the erase gate 170B.

The semiconductor memory device 100 may include at least one oxidation region 150. The oxidation region 150 may be formed on a top surface of the semiconductor substrate SUB. The oxidation region 150 may be formed between the channel regions 180A and 180B. The erase gates 170A, 170B and/or 170C may be disposed (or formed) inside the oxidation region 150.

The erase gates 170A, 170B and 170C may be formed in the direction of bit lines of the semiconductor memory device 100. The erase gates 170A, 170B and 170C may be formed in the direction perpendicular to word lines of the semiconductor memory device 100.

The semiconductor memory device 100 may include a control gate 110. The control gate 110 may be formed over the charge trap layer 130.

The semiconductor memory device 100 may include a blocking oxide layer 120 and a tunneling oxide layer 140. The blocking oxide layer 120 may be disposed (or formed) between the control gate 110 and the charge trap layer 130. The blocking oxide layer 120 may prevent electrons or holes from being moved (or transferred) between the control gate 110 and the charge trap layer 130. The tunneling oxide layer 140 may be disposed (or formed) between the charge trap layer 130 and the erase gates 170A, 170B and 170C. The tunneling oxide layer 140 transfers electrons or holes to the charge trap layer 130.

The semiconductor memory device 100 may have an erase mode, a program mode and a read mode. In the program mode, electrons may be stored in the charge trap layer 130 according to a logic level of data that is to be programmed. In the read mode, data having a specific logic level is output according to the amount of electrons that are stored in the charge trap layer 130. In the erase mode, electrons stored in the charge trap layer 130 may be removed.

Figure 2:
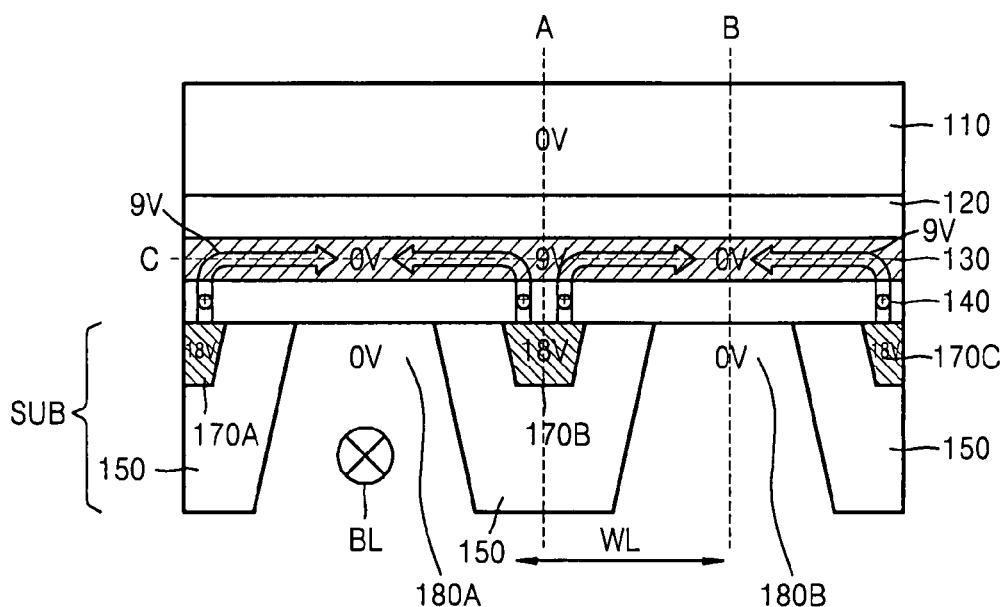

FIG. 2 is a diagram illustrating an erase operation in the semiconductor memory device 100 illustrated in FIG. 1.

Referring to FIG. 2, in the erase mode, a high voltage (e.g., 18V) may be applied to the erase gates 170A, 170B and 170C. A low voltage (e.g., 0V) may be applied to the control gate 110 and the channel regions 180A and 180B. A different high voltage or a different low voltage may be used as long as voltages are sufficient to transfer holes from the erase gates 170A, 170B and 170C to the charge trap layer 130.

Hereinafter, for convenience of description, it is assumed that the high voltage is 18V and the low voltage is 0V. Also, various voltages that are utilized to achieve different purposes in the semiconductor memory device 100 may be used as the high and low voltages.

Voltage values "0V" and "9V" denoted in the charge trap layer 130 of FIG. 2 represent relative voltages which are generated by voltages applied near the charge trap layer 130, not voltages that are directly applied to the charge trap layer 130. For example, a region of the charge trap layer 130, on which the erase gate 170B is formed, has a voltage of 9V due to the voltage of 18V that is applied to the erase gate 170B and the voltage of 0V that is applied to the control gate 110.

In the erase mode, if the high voltage (e.g., 18V) is applied to the erase gates 170A, 170B and 170C, a plurality of holes are injected into (or transferred to) the charge trap layer 130. The plurality of holes may be injected into regions (e.g., regions denoted by 9V in FIG. 2) of the charge trap layer 130 on which the erase gates 170A, 170B and 170C are formed. With respect to an energy band, the plurality of holes may be injected into (or transferred to) a valence band of the charge trap layer 130.

The holes injected into (transferred to) the charge trap layer 130 drift (or migrate) into regions (e.g., regions denoted by 0V in FIG. 2) of the charge trap layer 130 on which the channel regions 180A and 180B are formed due to a voltage difference. Programmed electrons may be stored in the regions of the charge trap layer 130, on which the channel regions 180A and 180B are formed. The drifted holes may be recombined (or combined) with the programmed electrons such that the programmed electrons are removed.

If a conventional charge trap memory device is in the erase mode, an interface trap and/or an oxide trap may form if a high voltage is applied to a semiconductor substrate. In the semiconductor memory device 100 according to example embodiments, because no high voltage is applied to the semiconductor substrate SUB, an interface trap and/or an oxide trap may not generated (or formed).

Figure 3A:
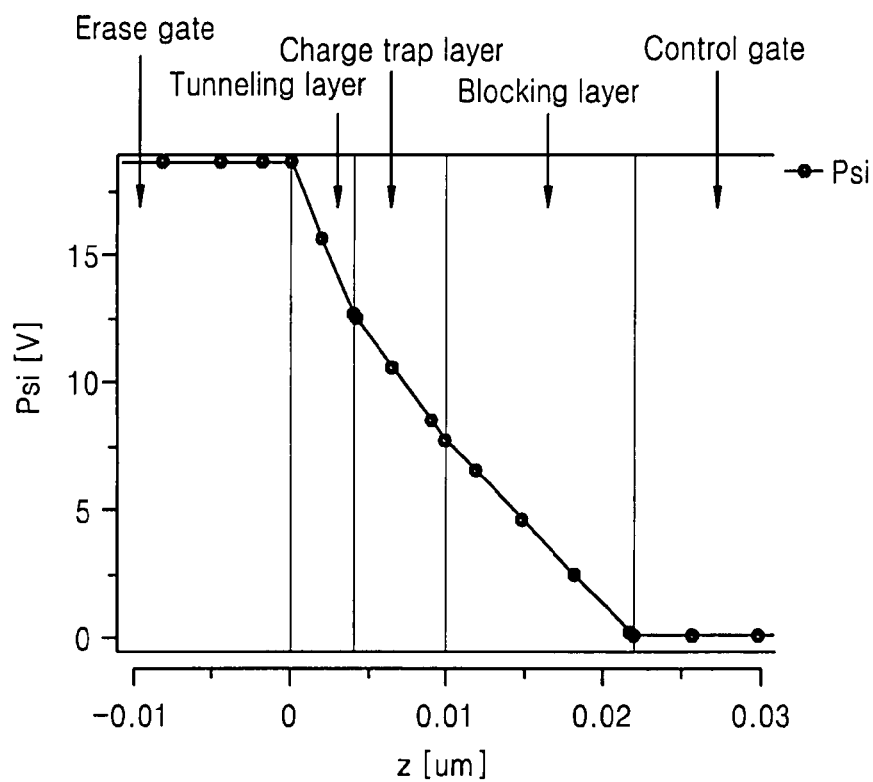
FIG. 3A is a graph showing a voltage distribution along the vertical dotted line A in the semiconductor memory device illustrated in FIG. 2.

FIG. 3A is a graph showing a voltage distribution along the vertical dotted line A in the semiconductor memory device illustrated in FIG. 2.

FIG. 3A shows a voltage distribution if a voltage 18V is applied to the erase gates 170A, 170B and 170C and a voltage 0V is applied to the control gate 110. The regions of the charge trap layer 130, on which the erase gates 170A, 170B and 170C are formed, have a voltage of about 9V.

Figure 3B:
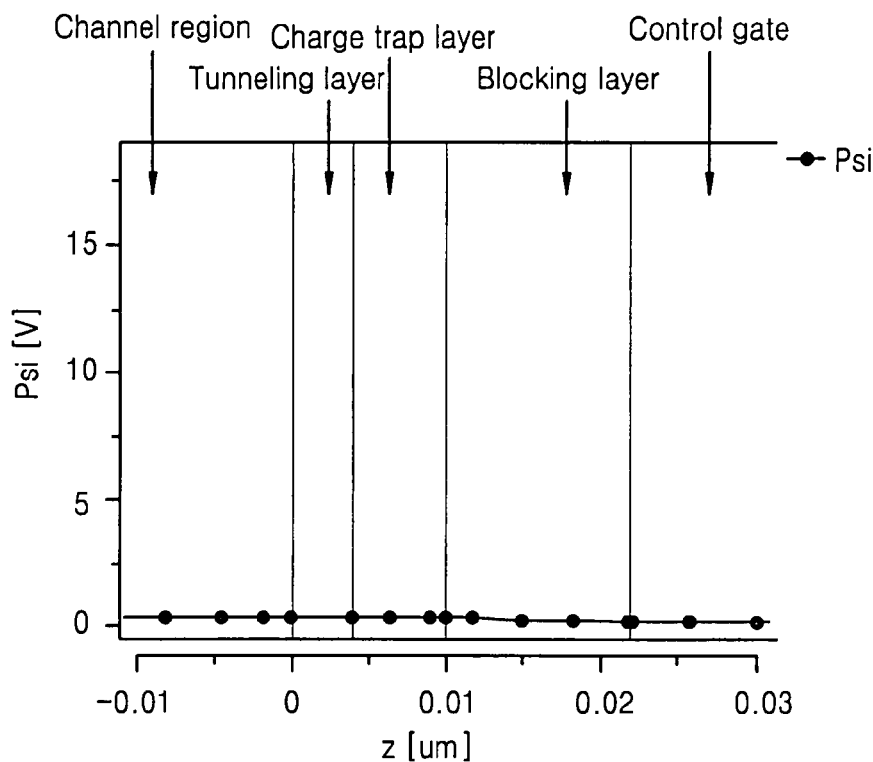
FIGS. 3B and 3D are graphs showing a voltage distribution along the vertical dotted line B in the semiconductor memory device illustrated in FIG. 2.
Figure 3C:
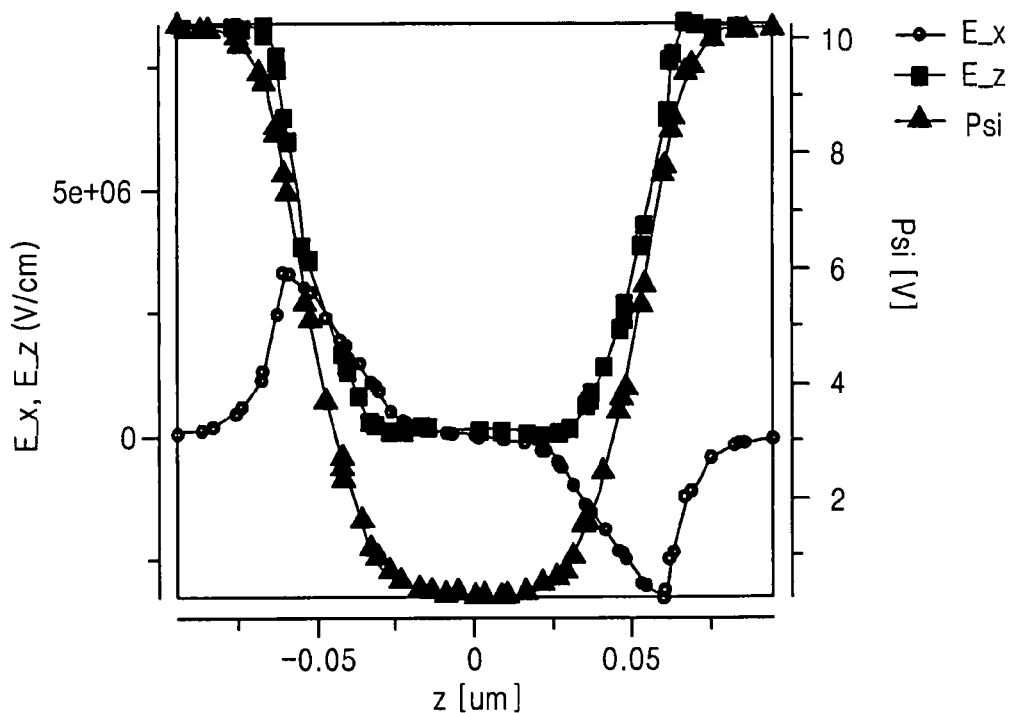
FIG. 3C is a graph showing a voltage distribution and an energy distribution along a horizontal dotted line C in the semiconductor memory device illustrated in FIG. 2.
Figure 3D:
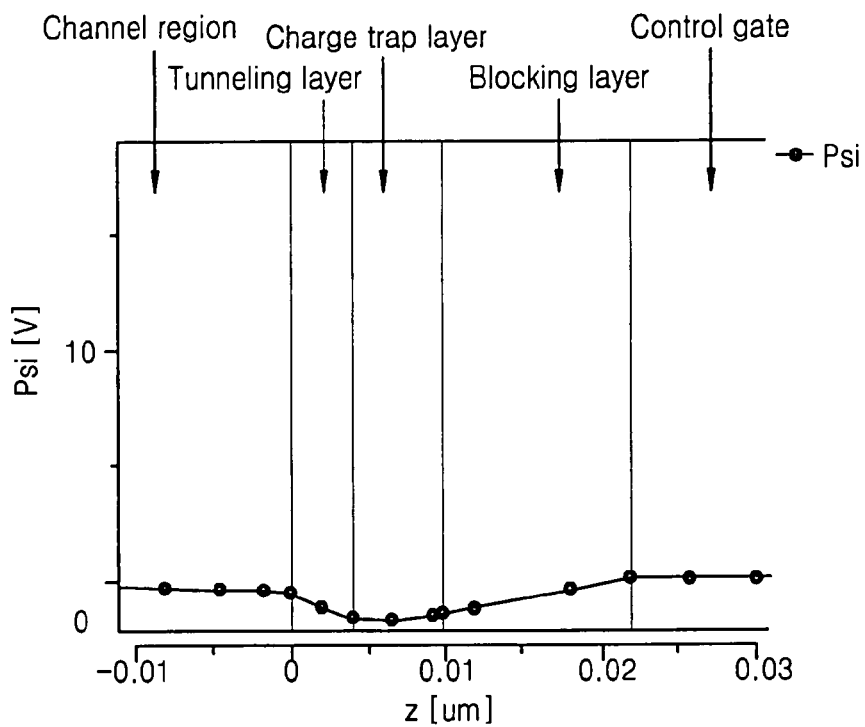

FIGS. 3B and 3D are graphs showing a voltage distribution along the vertical dotted line B in the semiconductor memory device illustrated in FIG. 2.

FIGS. 3B and 3D show a voltage distribution if a voltage 0V is applied to the channel regions 180A and 180B and the control gate 110. Regions of the charge trap layer 130, on which the channel regions 180A and 180B are formed, have a voltage of about 0V.

FIG. 3B shows a voltage distribution if no electrons are stored in the charge trap layer 130. FIG. 3D shows a voltage distribution if electrons are stored in the charge tap layer 130. The voltage of the charge trap layer 130 illustrated in FIG. 3D is lower than the voltage of the charge trap layer 130 illustrated in FIG. 3B.

FIG. 3C is a graph showing a voltage distribution and an energy distribution along the horizontal dotted line C in the semiconductor memory device illustrated in FIG. 2. FIG. 3C shows a voltage distribution and an energy distribution in the charge trap layer 130.

Referring to FIG. 3C, regions of the charge trap layer 130, on which the channel regions 180A and 180B are formed, have a voltage of about 0V. Regions of the charge trap region 130, on which the erase gates 170A, 170B and 170C are formed, have a voltage of about 9V.

Figure 4:
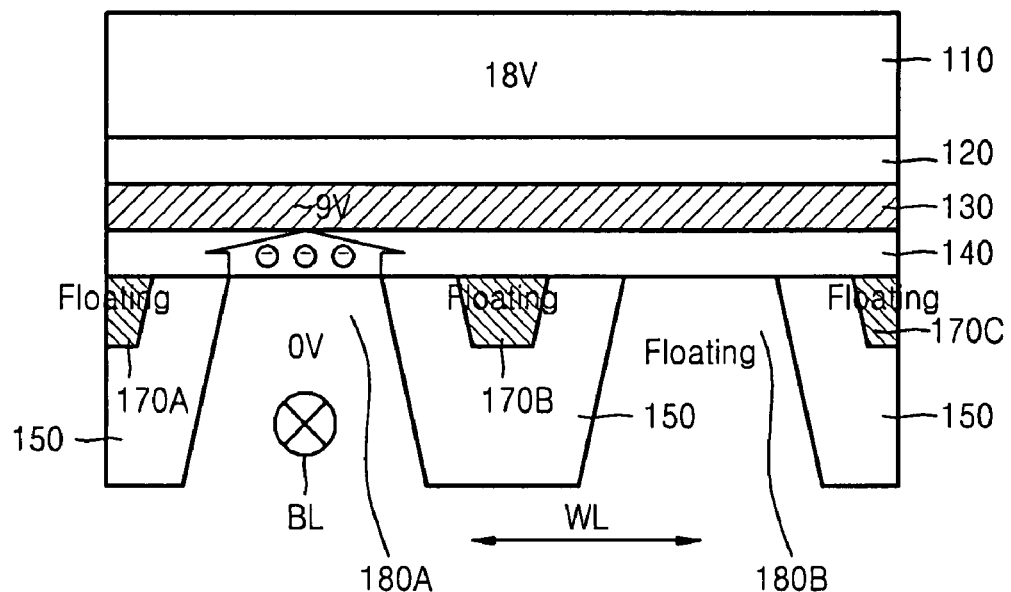

FIG. 4 is a diagram illustrating a program operation in the semiconductor memory device 100 illustrated in FIG. 1.

Referring to FIG. 4, in the program mode, the erase gates 170A, 170B and 170C are floated and a high voltage (e.g., a voltage of 18V) is applied to the control gate 110. A voltage of 0V is applied to a channel region (e.g., the channel region 180A), which is located below a region of the charge trap layer 130 to be programmed. The remaining channel region (e.g., the channel region 180B) may be floated.

Due to the voltage of approximately 0V (applied to the channel region 180A) and the voltage of 18V (applied to the control gate 110), a region of the charge trap layer 130, on which the channel region 180A is formed, has a voltage of approximately 9V. Electrons of the channel region 180A may be injected into (or transferred to) the charge trap layer 130.

Figure 5:
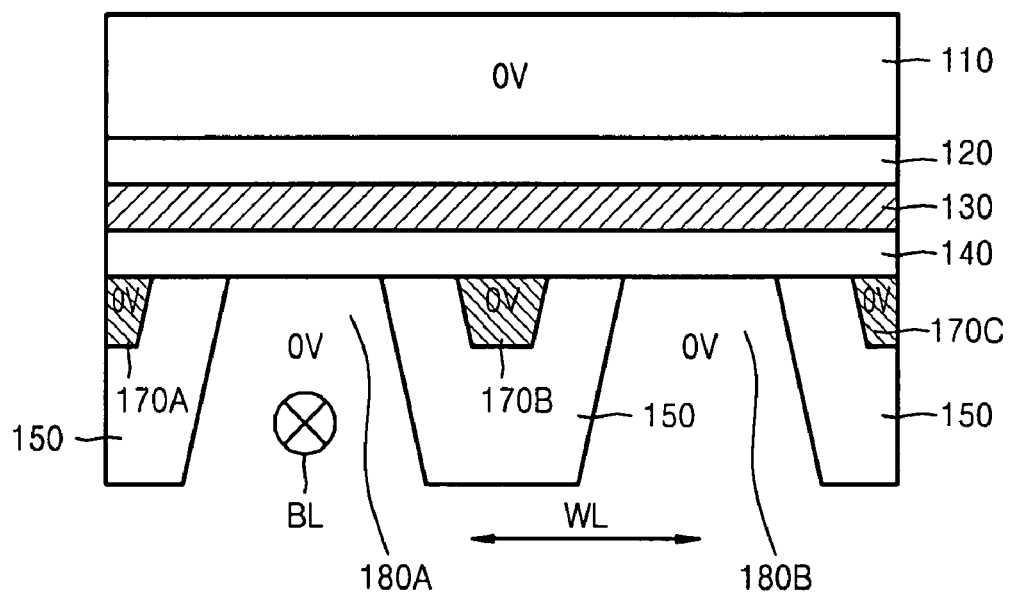

FIG. 5 is a diagram illustrating a read operation in the semiconductor memory device 100 illustrated in FIG. 1.

Referring to FIG. 5, in the read mode, a low voltage of approximately 0V is applied to the erase gates 170A, 170B and 170C and the control gate 110. A low voltage of approximately 0V may be applied to the channel regions 180A and 180B. The amount of electrons stored in the charge trap region 130 may detected.

FIGS. 6A to 6F are diagrams illustrating a method of manufacturing a semiconductor memory device according to example embodiments.

Referring to FIGS. 6A-6F, the method of manufacturing a semiconductor memory device according to example embodiments may include forming an oxidation region 150; forming at least one erase gate 170A and forming a charge trap layer 130. Forming the at least one erase gate may include forming a plurality of erase gates 170A, 170B and/or 170C.

Forming the oxidation region 150 may include forming at least one oxidation region 150 on a surface of a semiconductor substrate (not shown).

Forming at least one erase gate 170A and 170B may include forming erase gates 170A and 170B having a conductive material (not shown) on the at least one oxidation region 150.

Forming the charge trap layer 130 may include forming the charge trap layer 130 on the surface of the semiconductor substrate, wherein the charge trap layer 130 stores electrons.

The method of manufacturing a semiconductor memory device according to example embodiments may include forming a control gate 110 on the charge trap layer 130 after forming the at least one erase gate 170A. A blocking oxide layer 120 and a tunneling oxide layer 140 may be formed on an upper and a lower surface of the charge trap layer 130, respectively.

The method of manufacturing a semiconductor memory device according to example embodiments may include forming spacers 141 and doping source/drain regions (not shown). Forming the spacers 141 may include forming the spacers 141 on sidewalls of a structure in which the charge trap layer 130, the tunneling oxide layer 140, the blocking oxide layer 120 and the control gate 110 are sequentially stacked. The spacers 141 function to isolate the charge trap layer 130, the control gate 110, the blocking oxide layer 120 and the tunneling oxide layer 140 from the outside.

Figure 7:
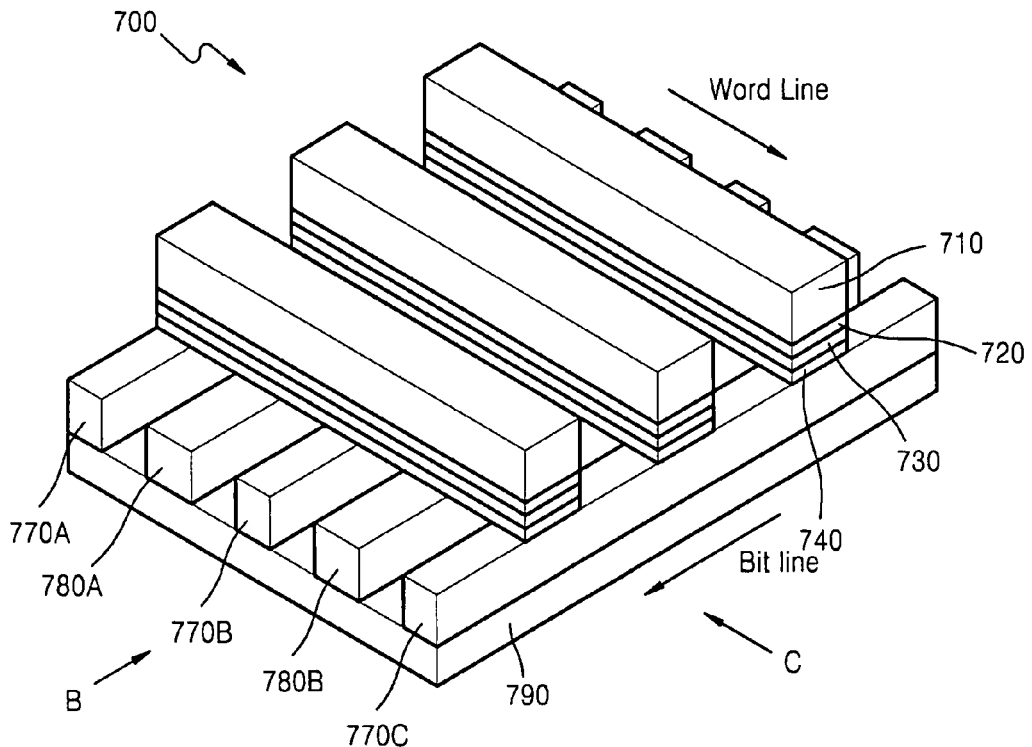

FIG. 7 is a diagram illustrating a perspective view of a semiconductor memory device 700 according to example embodiments.

The semiconductor memory device 700 has the same structure as the semiconductor memory device 100 illustrated in FIG. 2, except that the semiconductor memory device 700 includes an insulation layer 790 instead of a semiconductor substrate SUB. The semiconductor memory device 700 has an erase mode, a program mode and a read mode. Hereinafter, like construction and operation between the semiconductor memory device 700 in FIG. 7 and the semiconductor memory device 100 in FIG. 3 will be omitted for the sake of brevity.

Referring to FIG. 7, the semiconductor memory device 700 according to example embodiments include an insulation layer 790, a charge trap layer 730 and at least one erase gate 770A. The semiconductor memory device 700 may include a plurality of erase gates 770A, 770B and/or 770C. The erase gates 770A, 770B, and 770C may be formed on the insulation layer 790. A plurality of charge trap layers 730 may be formed on the erase gates 770A, 770B and 770C. The plurality of charge trap layers 730 may store electrons.

In an erase mode including an operation of removing electrons stored in the charge trap layer 730, holes in the erase gates 770A, 770B and 770C may be injected into (or transferred to) the charge trap layer 730 to recombine (or combine) the electrons stored in the charge trap layer 730 with the holes. The electrons stored in the charge trap layer 730 may be removed. In the erase mode, a logic high voltage (e.g., a voltage of 18V) may be applied to the erase gates 770A, 770B and 770C.

If a conventional charge trap memory device is in an erase mode, a logic high voltage may be applied to a semiconductor substrate. In a structure that includes no semiconductor substrate (e.g., a Thin Film Transistor (TFT) or a Silicon On Insulator (SOI)), a conventional charge trap memory device cannot be implemented.

The semiconductor memory device 700 according to example embodiments injects (or transfers) holes to the charge trap layer 730 from the erase gates 770A, 7780B and 770C. In a structure in which components are arranged on an insulation layer (e.g., a TFT or a SOI) and not on a semiconductor substrate, a semiconductor memory device including a charge trap layer may be implemented.

The erase gates 770A, 770B and 770C may include a conductive material. The erase gates 770A, 770B and 770C may include metal or polysilicon.

The semiconductor memory device 700 may include at least one bit line 780A and 780B. The bit lines 780A and 780B may be arranged in the same direction as the erase gates 770A, 770B and 770C. The erase gates 770A, 770B and 770C may be arranged in a direction perpendicular to the charge trap layer 730.

The semiconductor memory device 700 may include a control gate 710. The control gate 710 may be formed on the charge trap layer 730. In the erase mode, a low voltage (e.g., a ground voltage) may be applied to the control gate 710.

Figure 8A:
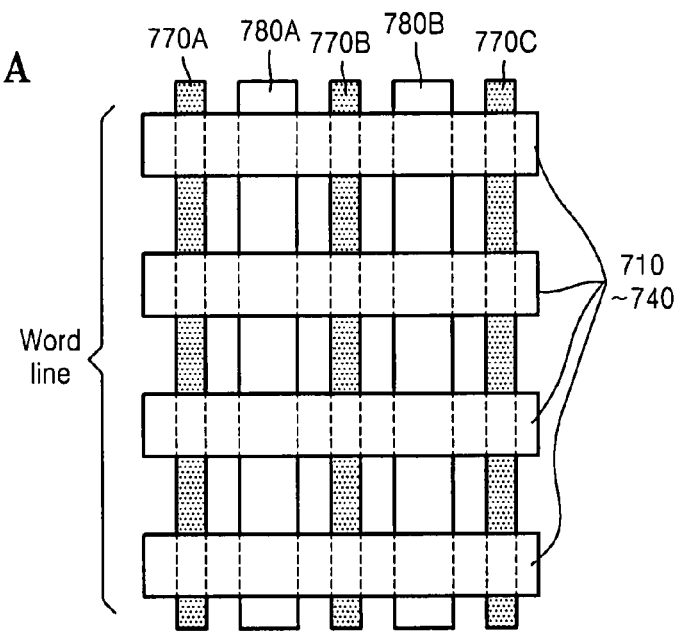
FIG. 8A is a diagram illustrating a plan view of the semiconductor memory device illustrated in FIG. 7.
Figure 8B:
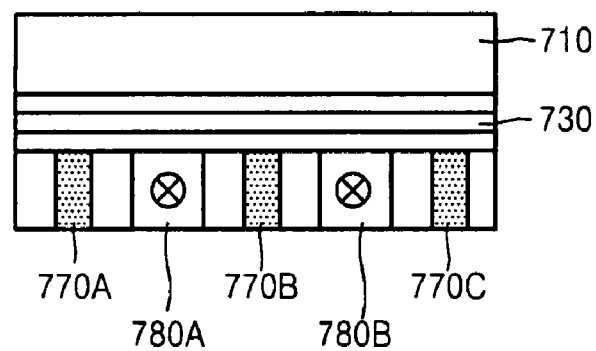
FIG. 8B is a diagram illustrating a cross-sectional view in a direction B shown in FIG. 7.
Figure 8C:
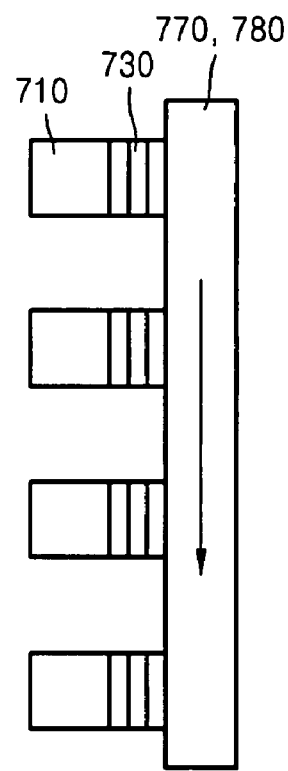
FIG. 8C is a diagram illustrating a cross-sectional view in a direction C shown in FIG. 7.
Figure 9A:
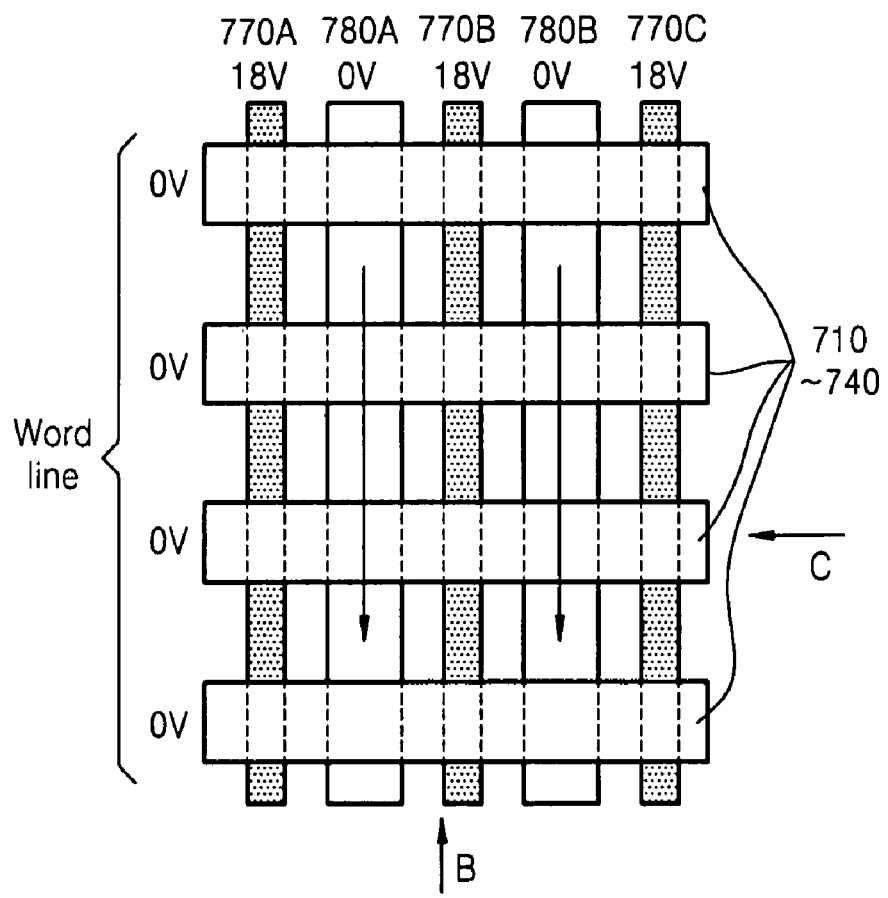
FIGS. 9A through 9D are diagrams illustrating an erase operation in the semiconductor memory device illustrated in FIG. 7.
Figure 9B:
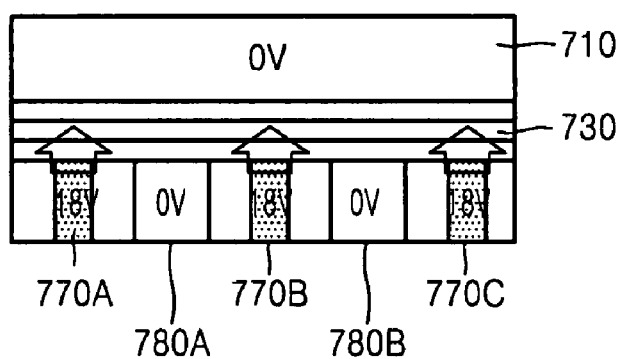
Figure 9C:
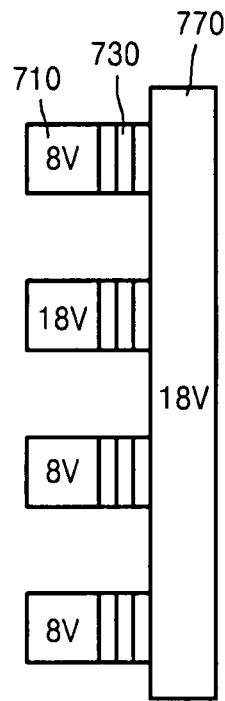
Figure 9D:
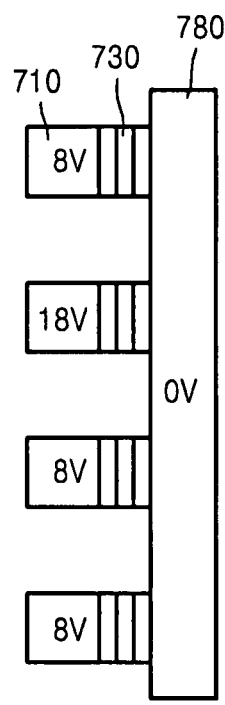
Figure 10A:
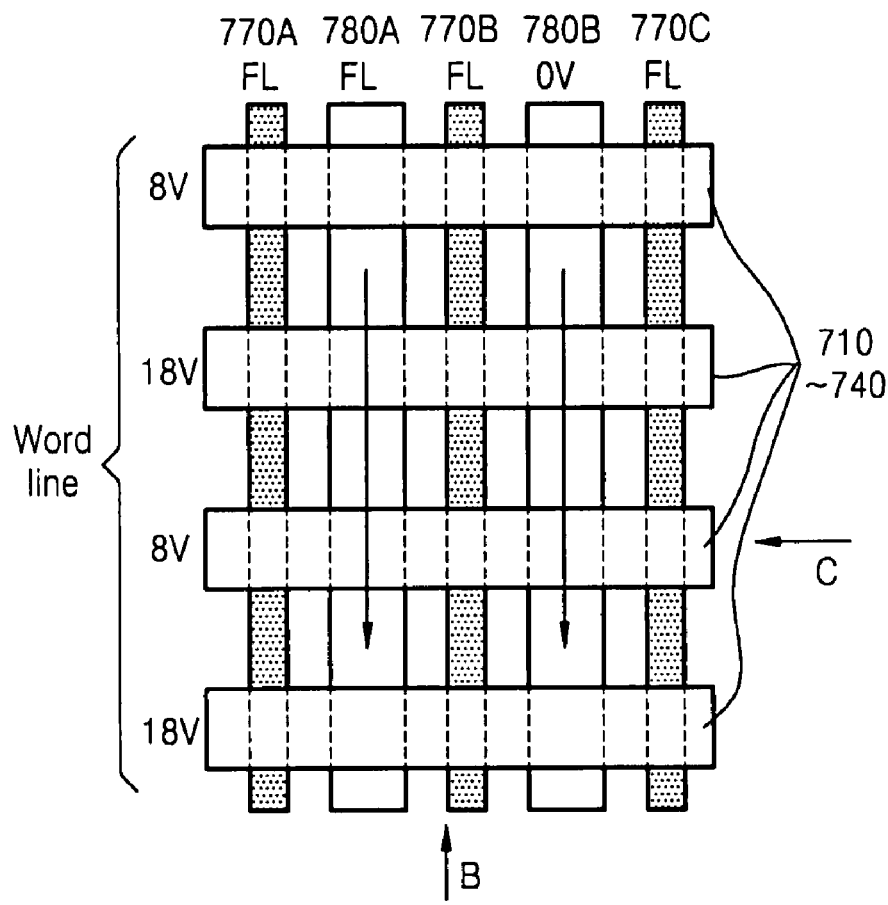
FIGS. 10A through 10D are diagrams illustrating a program operation in the semiconductor memory device illustrated in FIG. 7.
Figure 10B:
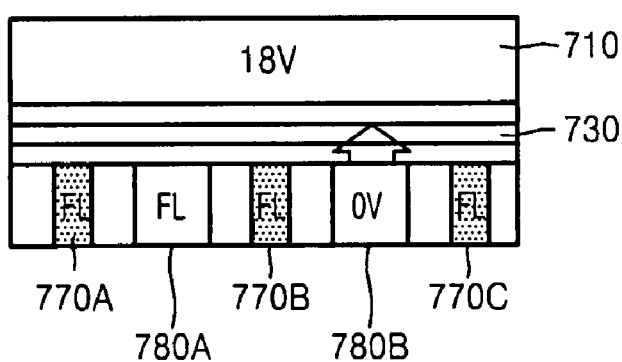
Figure 10C:
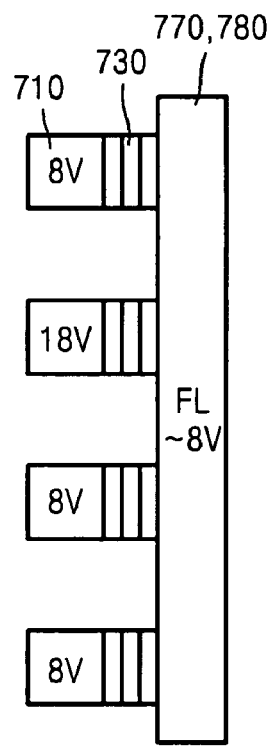
Figure 10D:
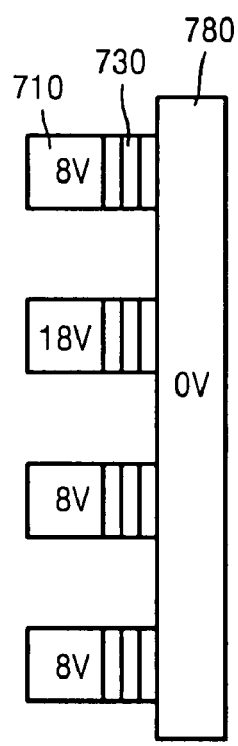
Figure 11A:
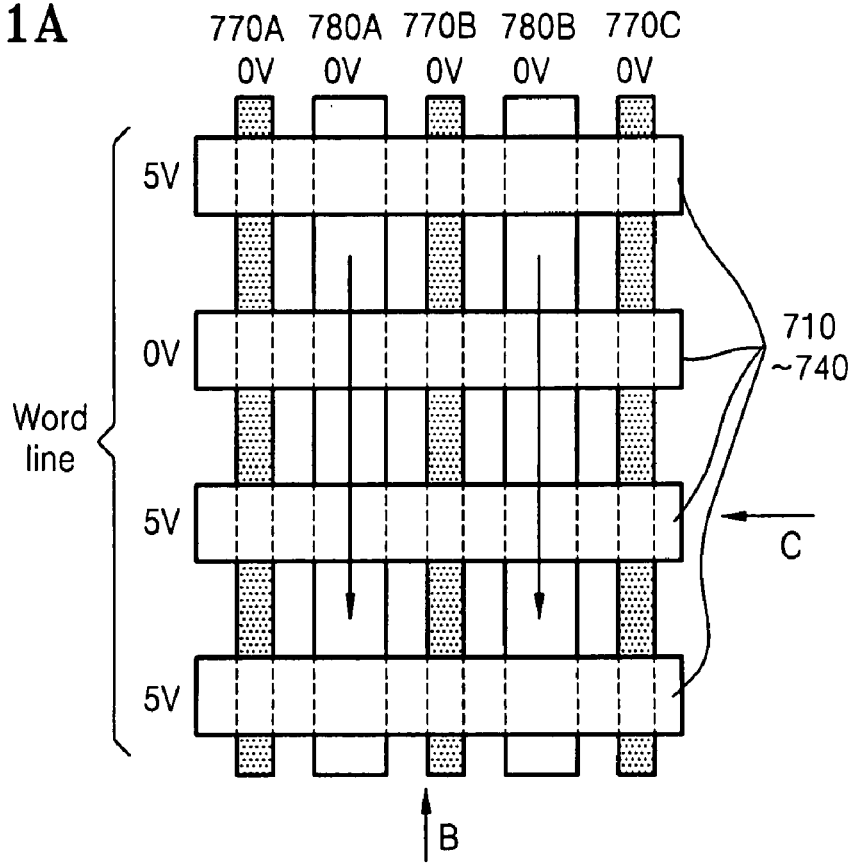
Figure 11B:
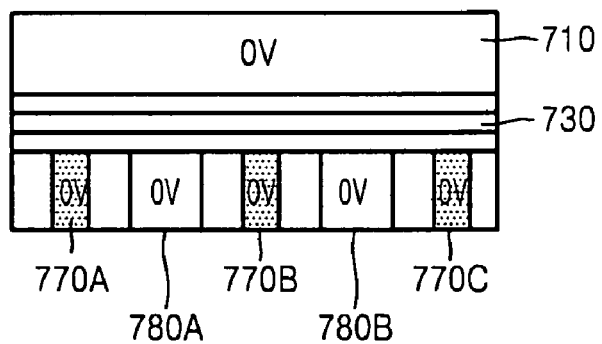
Figure 11C:
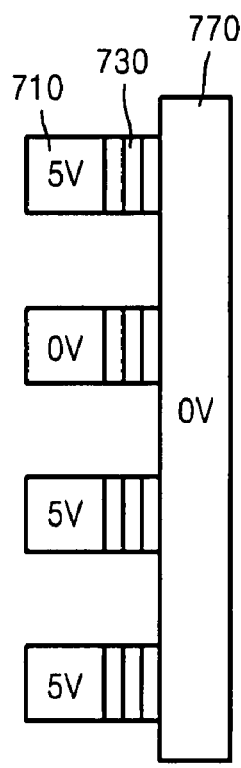
Figure 11D:
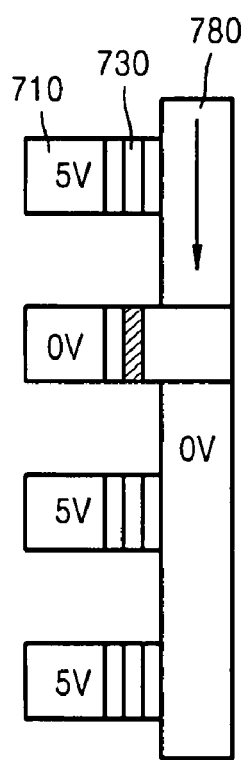
Figure 11E:
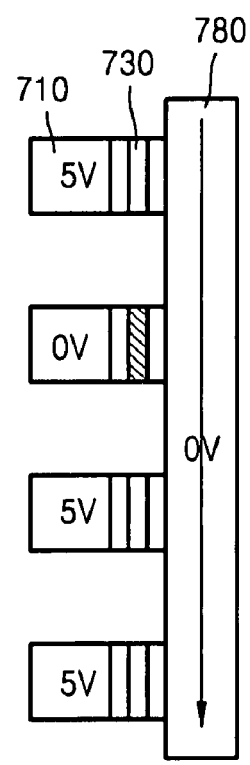

FIG. 8A is a diagram illustrating a plan view of the semiconductor memory device 700 illustrated in FIG. 7 according to example embodiments. FIG. 8B is a diagram illustrating a cross-sectional view in a direction B shown in FIG. 7. FIG. 8C is a diagram illustrating a cross-sectional view in a direction C shown in FIG. 7.

In FIGS. 8A, 8B and 8C, the bit lines 780A and 780B may be arranged in the same direction as the erase gates 770A, 770B and 770C. The bit lines 780A and 780B and the erase gates 770A, 770B and 770C may be arranged in a direction perpendicular to the charge trap layer 730.

FIGS. 9A through 9D are diagrams illustrating an erase operation in the semiconductor memory device 700 illustrated in FIG. 7.

FIGS. 10A through 10D are diagrams illustrating a program operation in the semiconductor memory device 700 illustrated in FIG. 7.

FIG. 11 is a diagram illustrating a read operation in the semiconductor memory device 700 illustrated in FIG. 7.

The erase operation, program operation and read operation of the semiconductor memory device 700 illustrated in FIG. 7 may be performed in a similar manner as the semiconductor memory device 100 illustrated in FIG. 2, thus detailed descriptions thereof are not provided.

As described above, in a semiconductor memory device and a method of manufacturing the same according to example embodiments, it may be possible to prevent the generation of (or reduce the likelihood of forming) an interface trap and/or an oxide trap, increasing the reliability of a semiconductor memory device.

According to example embodiments, a semiconductor memory device including a charge trap layer may be implemented in a structure having components may be directly arranged on an insulation layer (e.g., a TFT or a SOI).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a charge trap layer storing a first charge transfer medium having a first polarity; and
   at least one erase gate formed below the charge trap layer, wherein the at least one erase gate includes a second charge transfer medium having a second polarity opposite to the first polarity,
   wherein, in an erase mode, the second charge transfer medium migrates to the charge trap layer causing the first charge transfer medium to combine with the second charge transfer medium.

2. The semiconductor memory device of claim 1, wherein the first charge transfer medium is a plurality of electrons and the second charge transfer medium has holes.

3. The semiconductor memory device of claim 2, wherein the charge trap layer is on a semiconductor substrate that includes at least one channel region in a top surface of the semiconductor substrate,
   wherein, in a program mode, electrons stored in the at least one channel region migrate to the charge trap layer.

4. The semiconductor memory device of claim 3, wherein the at least one erase gate is between at least two channel regions.

5. The semiconductor memory device of claim 3, further comprising at least one oxidation region on the semiconductor substrate, wherein the at least one oxidation region is between the at least one erase gate and the at least one channel region.

6. The semiconductor memory device of claim 2, further comprising a control gate on the charge trap layer.

7. The semiconductor memory device of claim 6, further comprising a blocking oxide layer between the control gate and the charge trap layer, wherein the blocking oxide layer prevents electrons or holes from migrating between the control gate and the charge trap layer.

8. The semiconductor memory device of claim 2, further comprising a tunneling oxide layer between the charge tap layer and the at least one erase gate, wherein the tunneling oxide layer transfers electrons or holes to the charge trap layer.

9. The semiconductor memory device of claim 2, wherein the charge trap layer is on a bulk silicon semiconductor substrate.

10. The semiconductor memory device of claim. 1, wherein, in the erase mode, a logic high voltage is applied to the at least one erase gate.

11. The semiconductor memory device of claim 1, wherein the at least one erase gate includes a conductive material.

12. The semiconductor memory device of claim 11, wherein the conductive material includes metal or polysilicon.

13. The semiconductor memory device of claim 1, wherein the at least one erase gate is parallel to bit lines of the semiconductor memory device.

14. The semiconductor memory device of claim 1, wherein the at least one erase gate is perpendicular to word lines of the semiconductor memory device.

15. A semiconductor memory device, comprising:
at least one erase gate formed on an insulation layer; and
a charge trap layer formed on the at least one erase gate, wherein the charge trap layer stores a first charge transfer medium having a first polarity and the at least one erase gate includes a second charge transfer medium having a second polarity opposite to the first polarity,
wherein, in an erase mode, the second charge transfer medium migrates to the charge trap layer causing the first charge transfer medium to combine with the second charge transfer medium.

16. The semiconductor memory device of claim 15, wherein the first charge transfer medium is a plurality of electrons and the second charge transfer medium has holes.

17. The semiconductor memory device of claim 15, wherein, in the erase mode, a logic high voltage is applied to the at least one erase gate.

18. The semiconductor memory device of claim 15, wherein the at least one erase gate includes a conductive material.

19. The semiconductor memory device of claim 15, wherein the at least one erase gate is perpendicular to the charge trap layer.

20. The semiconductor memory device of claim 15, further comprising at least one bit line parallel to the at least one erase gate.

* * * * *